United States Patent
You et al.

(10) Patent No.: US 10,530,343 B2
(45) Date of Patent: Jan. 7, 2020

(54) SYSTEM FOR MONITORING OPERATION EXECUTION OF PULSE WIDTH MODULATION DUTY FOR MOTOR CONTROL

(71) Applicants: Hyundai Motor Company, Seoul (KR); Kia Motors Corporation, Seoul (KR)

(72) Inventors: Chang Seok You, Gyeonggi-do (KR); Min Su Kang, Gyeonggi-do (KR); Sung Do Kim, Seoul (KR); Dong Hun Lee, Gyeonggi-Do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 16/151,644

(22) Filed: Oct. 4, 2018

(65) Prior Publication Data

US 2019/0356304 A1    Nov. 21, 2019

(30) Foreign Application Priority Data

May 17, 2018 (KR) .................. 10-2018-0056263

(51) Int. Cl.
*H03K 3/017*     (2006.01)
*H03K 7/08*      (2006.01)
*B60R 16/023*    (2006.01)
*H02P 6/08*      (2016.01)

(52) U.S. Cl.
CPC ......... *H03K 3/017* (2013.01); *B60R 16/0232* (2013.01); *H02P 6/08* (2013.01)

(58) Field of Classification Search
CPC combination set(s) only.
See application file for complete search history.

(56) References Cited

U.S. PATENT DOCUMENTS

| 7,646,808 | B2 * | 1/2010 | Kris | .................. | H03K 7/08 |
| | | | | | 375/238 |
| 9,231,506 | B2 * | 1/2016 | Hiraki | .................. | H02P 6/34 |
| 9,490,792 | B2 * | 11/2016 | Zhao | .................. | H03K 7/08 |
| 9,853,589 | B2 * | 12/2017 | Jing | .................. | H02P 6/15 |

\* cited by examiner

*Primary Examiner* — An T Luu
(74) *Attorney, Agent, or Firm* — Mintz Levin Cohn Ferris Glovsky and Popeo, P.C.; Peter F. Corless

(57) ABSTRACT

A system for monitoring pulse width modulation (PWM) duty operation execution for motor control, which can detect whether or not the PWM duty operation execution used for torque and speed control of a motor is performed normally within an interrupt execution timing, and perform failure diagnosis depending upon the detected result, thus enhancing stability of motor control.

8 Claims, 6 Drawing Sheets

SYSTEM FOR MONITORING OPERATION EXECUTION OF PULSE WIDTH MODULATION DUTY FOR MOTOR CONTROL

CROSS-REFERENCE TO RELATED APPLICATION

This application claims under 35 U.S.C. § 119(a) the benefit of Korean Patent Application No. 10-2018-0056263 filed on May 17, 2018, the entire contents of which are incorporated herein by reference.

BACKGROUND

(a) Technical Field

The present disclosure relates to a system for monitoring pulse width modulation (PWM) duty operation execution for motor control, more particularly, to a system for monitoring PWM duty operation execution for the motor control that can detect whether or not the PWM duty operation execution for the motor control is performed normally, and perform failure diagnosis depending upon the detected result, thus enhancing stability of motor control.

(b) Description of the Related Art

Generally, a Pulse Width Modulation (PWM) control method by a three-phase inverter is used to perform torque or speed control of a motor.

That is, the torque or speed of the motor can be controlled by operating a PWM duty in a motor control unit (an inverter) and controlling the current applied to the motor depending upon the operated duty.

Particularly, the motor control unit must determine the duty for each PWM control cycle, and the duty at that time is operated based on an output current value, a phase current sensing value, etc. of a current controller included in the Motor Control Unit (MCU).

The PWM duty must be operated again for each PWM control cycle, and in this time, when the PWM duty is not operated accurately for each cycle due to an operation error, resulting in instability of the current control for the motor. In turn, this causes instability in performing the torque or speed control of the motor, resulting in a decrease in the motor control quality and failure of the motor.

Accordingly, it is important to confirm whether or not the PWM duty is operated for each PWM cycle and is updated normally in order to maintain stability of the motor control.

As described above, updating the PWM duty is composed of delivering the PWM duty operated based on the output current value, the phase current sensing value, etc. of the current controller to a PWM generation module included in the motor control unit, and generating a physical PWM signal in the PWM generation module based on the received duty.

The PWM generation module needs time for generating the PWM signal depending upon the received duty, such that it sets a minimum reference time that must update a new duty before the end timing of the PMW cycle, and this is referred to as a PWM update time.

However, operating the PWM duty in the motor control unit is performed in an interrupt function, and when the interrupt function for operating the PWM duty is terminated and the time for operating the PWM duty exceeds the PWM update time, the PWM duty is not updated normally, resulting in a decrease in the stability of the motor control.

Accordingly, in the related art, in order to monitor whether or not operating the PWM duty in the motor control unit is performed normally in the interrupt function, a method of separately mounting a watchdog chip in the motor control unit is generally used, but it is a disadvantage in that the cycle that can monitor as fast as possible in the watchdog chip is generally only a few tens of milliseconds, such that it is too slow to monitor the interrupt execution timing of several tens of microseconds, which is a general PWM cycle, and is not suitable for an interrupt execution monitoring use.

The above information disclosed in this Background section is only for enhancement of understanding of the background of the disclosure and accordingly, it can contain information that does not form the prior art that is already known in this country to a person of ordinary skill in the art.

SUMMARY

The present disclosure provides a system for monitoring PWM duty operation execution for motor control, which can detect whether or not the PWM duty operation execution used for torque and speed control of a motor is performed normally within a reference interrupt execution timing, and perform failure diagnosis depending upon the detected result, thus enhancing stability of the motor control.

The present disclosure for achieving the object provides a system for monitoring PWM duty operation execution for motor control including a motor control unit for operating a PWM duty for motor control, and outputting a confirmation signal of a PWM duty operation execution for determining whether or not the PWM duty is updated normally to a detection and failure diagnosis circuit; and the detection and failure diagnosis circuit for outputting a failure determination signal for determining whether or not the operation execution and update of the PWM duty are performed normally within a PWM duty update reference timing based on the confirmation signal of the PWM duty operation execution.

In a preferred embodiment, the motor control unit is configured to include a PWM duty control section for operating a duty for each PWM control cycle for a motor; a PWM generation module for receiving the duty operated in the PWM duty control section to generate a PWM signal; a PWM duty operation interrupt controller for receiving a PWM duty operation trigger signal from the PWM generation module, and then generating an interrupt signal that outputs the confirmation signal of the PWM duty operation execution for the PWM duty control section and delivering it thereto; and a failure information determination section for receiving a failure determination signal in the detection and failure diagnosis circuit, and extracting only failure information to store it in a memory.

In a preferred embodiment, the detection and failure diagnosis circuit is configured to include a clock PLL circuit for receiving a clock signal from an external oscillator to generate a clock signal required for a counter generator; the counter generator for receiving a PWM duty operation execution signal outputted from the digital output section of the motor control unit and the clock signal outputted from the clock PLL circuit to generate and output a first counter signal (a counter signal confirming the PWM duty operation execution time) and a second counter signal (a counter signal confirming the PWM duty operation execution cycle) required for failure determination for the PWM duty operation and update; and a failure determination circuit for outputting a first failure determination signal (a failure determination signal of the PWM duty operation execution time) and a second failure determination signal (a failure determination signal of the PWM duty operation execution cycle) as a signal for determining whether or not the PWM duty operation execution and update fails based on the first counter signal (the counter signal confirming the PWM duty operation execution time) and the second counter signal (the counter signal confirming the PWM duty operation execution cycle) outputted from the counter generator.

The present disclosure provides the following effects through the above configuration.

First, it is possible to detect the confirmation signal confirmation signal (the time and the cycle of the PWM duty operation execution) of the PWM duty operation execution for the motor control, and perform the failure diagnosis for the motor control unit based on the detected signal, thus enhancing stability of the motor control.

Second, it is possible for the motor control unit to determine whether or not the PWM duty operated for each PWM control cycle is updated normally, thus accurately determining whether or not the motor control unit fails.

Third, it is possible to determine the failure that the PWM duty is not updated normally, and then to induce the maintenance for the motor control unit through the warning.

Other aspects and preferred embodiments of the disclosure are discussed infra.

BRIEF DESCRIPTION OF THE DRAWINGS

The above and other features of the present disclosure will now be described in detail with reference to certain exemplary embodiments thereof illustrated in the accompanying drawings which are given herein below by way of illustration only, and thus are not limitative of the present disclosure, and wherein.

Figure 1:
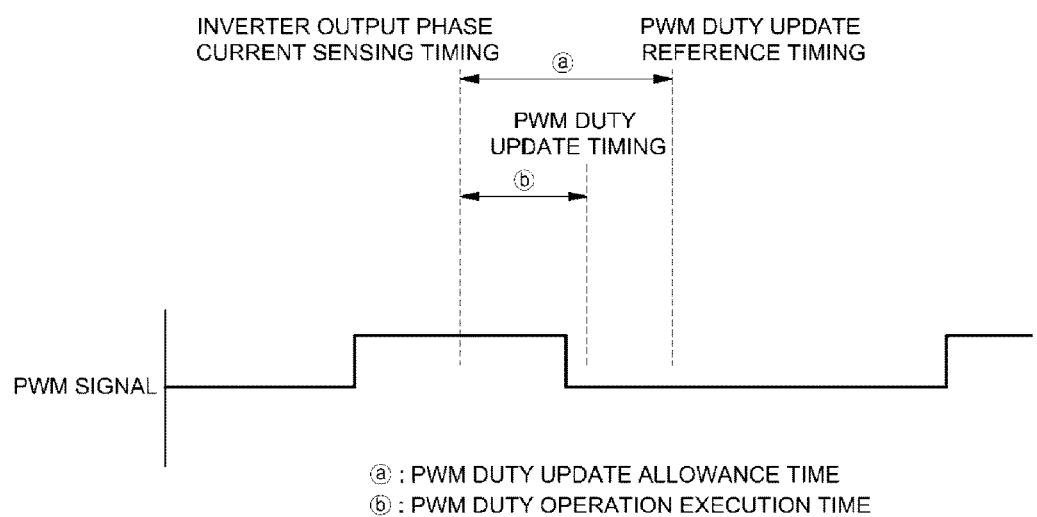
FIG. 1 is a graph illustrating an update timing of a PWM duty for motor control.

It should be understood that the appended drawings are not necessarily to scale, presenting a somewhat simplified representation of various preferred features illustrative of the basic principles of the disclosure. The specific design features of the present disclosure as disclosed herein, including, for example, specific dimensions, orientations, locations, and shapes will be determined in section by the particular intended application and use environment.

In the figures, reference numbers refer to the same or equivalent sections of the present disclosure throughout the several figures of the drawing.

DETAILED DESCRIPTION

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, exemplary embodiments of the present disclosure will be described with reference to the accompanying drawings so that those skilled in the art can easily practice the present disclosure. However, the present disclosure is not limited to those exemplary embodiments and can be embodied in other forms.

Hereinafter, preferred embodiments of the present disclosure will be described in detail with reference to the accompanying drawings.

As described above, a motor control unit must determine a duty for each PWM control cycle, and the duty at that time is operated by a PWM duty control section included in a Motor Control Unit (MCU) based on an output current value of a current controller and a phase current sensing value outputted from an inverter to the motor, etc.

It is one of the important factors for maintaining stability of the motor control to confirm whether or not the PWM duty is operated and updated normally for each PWM control cycle for a torque or speed control of the motor.

Updating the PWM duty is composed of delivering the PWM duty operated based on the output current value, the phase current sensing value, etc. of the current controller as described above to the PWM generation module included in the motor control unit, and generating a physical PWM signal based on the duty received from the PWM duty control section in a PWM generation module.

Referring to FIG. 1, the PWM duty control section operates (calculates) the PWM duty based on the phase current sensing value, such that the timing at which the PWM duty control section starts to operate the PWM duty can be regarded as an inverter output phase current sensing timing that detects the phase current outputted to the inverter.

In addition, the time (indicated by ⓑ in FIG. 1) from the inverter output phase current sensing timing to the PWM duty update timing for updating the PWM duty becomes a PWM duty operation execution time in the PWM duty control section.

In addition, the time (indicated by ⓐ in FIG. 1) from the inverter output phase current sensing timing to the PWM duty update reference timing becomes a PWM duty update allowance time.

Figure 2:
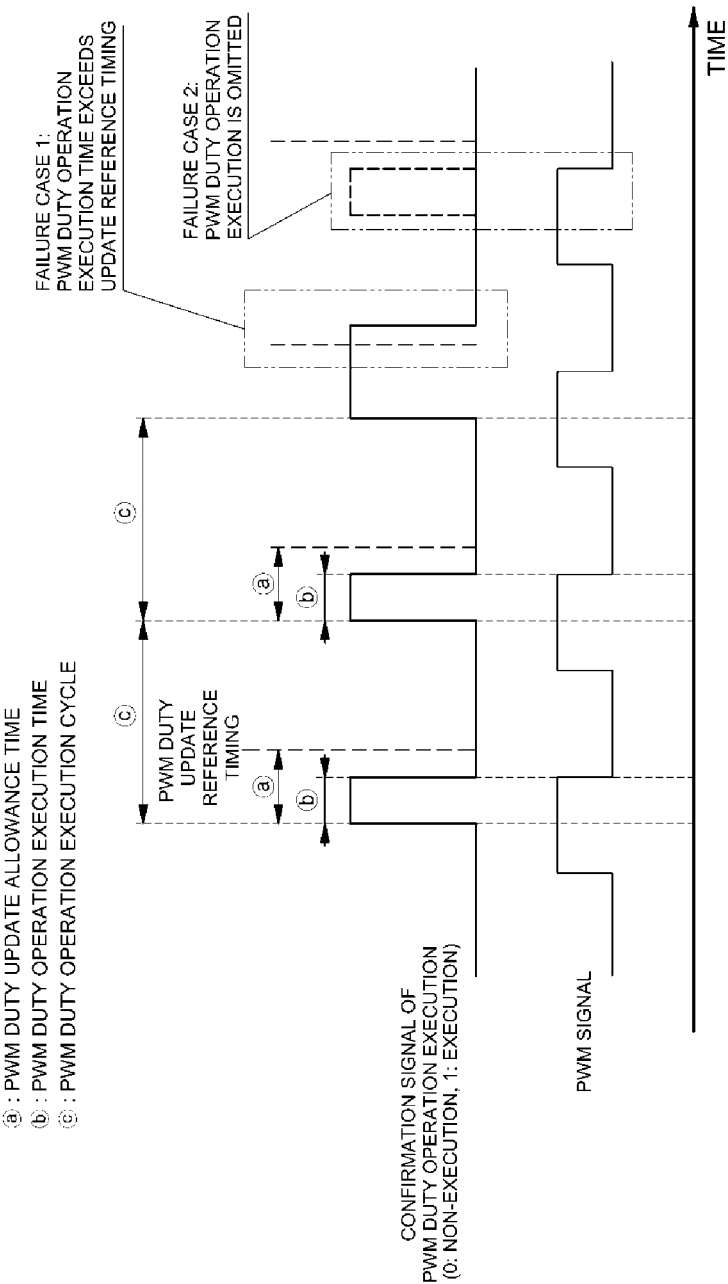
FIG. 2 is a graph illustrating a failure case occurring in an operation execution and update of the PWM duty for the motor control.

Referring to the left part of FIG. 2, when the PWM duty operation execution time ⓑ does not exceed the PWM duty update reference timing, that is, when the PWM duty operation execution time ⓑ does not exceed the PWM duty update allowance time ⓐ, the PWM generation module normally performs the PWM duty update.

On the other hand, as illustrated in the right part of FIG. 2, when as an example of a failure case, the PWM duty operation execution time ⓑ exceeds the PWM duty update reference timing, or as another example of the failure case, the PWM duty operation execution itself is omitted, the PWM duty is not updated normally, resulting in a decrease in stability of the motor control.

Accordingly, the present disclosure focuses on one point that can enhance stability of the motor control by detecting the confirmation signal (the PWM duty operation execution time and cycle) of the PWM duty operation execution and performing the failure diagnosis based on the detected signal.

Figure 3:
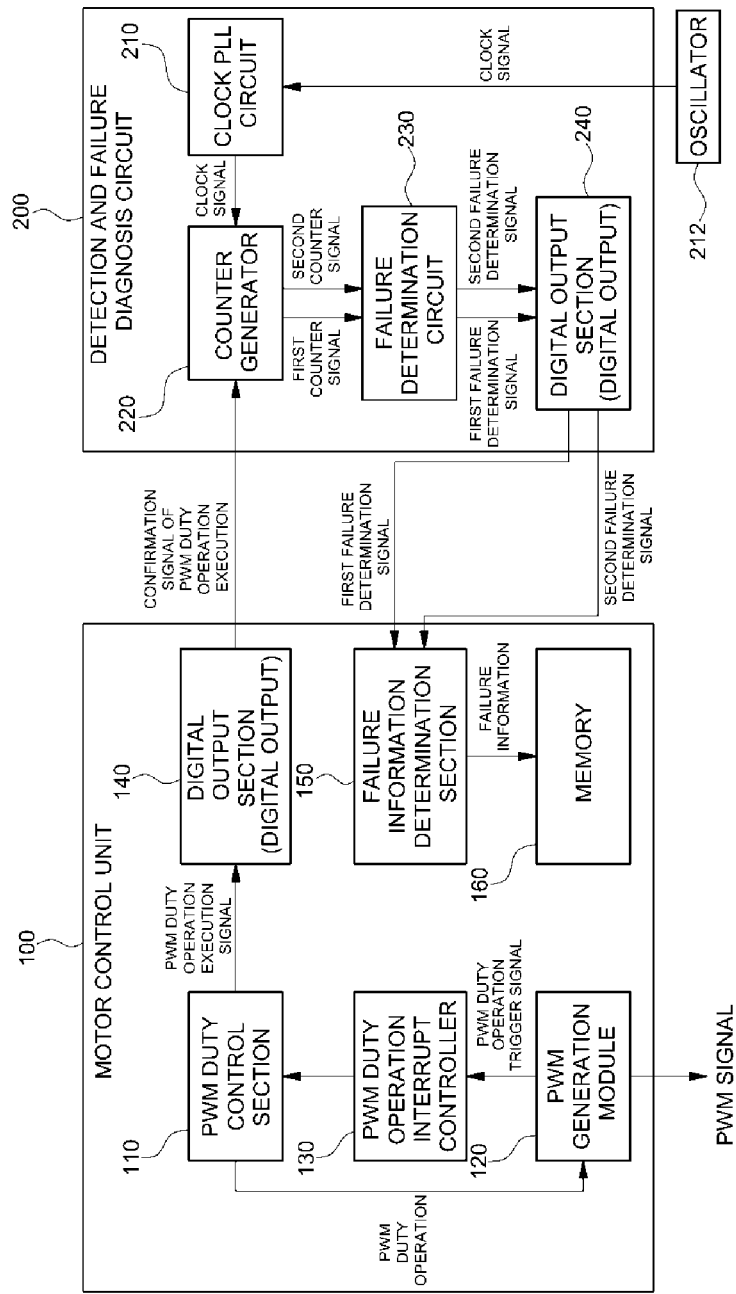
FIG. 3 is a configuration diagram of a system for monitoring the PWM duty operation execution for the motor control in accordance with the present disclosure.

FIG. 3 is a hardware configuration diagram illustrating a system for monitoring the PWM duty operation execution in accordance with the present disclosure; and a reference numeral 100 refers to a motor control unit, and a reference numeral 200 refers to a detection and failure diagnosis circuit.

The motor control unit 100 operates the PWM duty for motor control, and outputs the confirmation signal of the PWM duty operation execution for determining whether or not the PWM duty is updated normally to the detection and failure diagnosis circuit 200, and the detection and failure diagnosis circuit 200 outputs a failure determination signal that determines whether or not the operation execution and update of the PWM duty are performed normally within the PWM duty update reference timing based on the confirmation signal of the PWM duty operation execution received from the motor control unit 100.

The motor control unit 100 includes a PWM duty control section 110 for operating a duty for each PWM control cycle, and a PWM generation module 120 for receiving the duty operated by the PWM duty control section 110 to generate a PWM signal.

The PWM duty control section 110 operates the PWM duty based on an output current value of a current controller (not illustrated) included in the motor control unit and a phase current sensing value outputted to the motor from an inverter (not illustrated), and the PWM generation module 120 receives the duty operated by the PWM duty control-section 110 and generates the PWM signal required for the motor control to output it to the inverter.

A PWM duty operation interrupt controller 130 is connected between the PWM generation module 120 and the PWM duty control section 110 in order to deliver a signal.

The PWM duty operation interrupt controller 130 receives a PWM duty operation trigger signal (e.g., a trigger signal outputted at the PWM duty operation execution starting point matching with the center timing of the PWM signal) from the PWM generation module 120, and then generates an interrupt signal that outputs the confirmation signal (the PWM duty operation execution time and the PWM duty operation execution cycle) of the PWM duty operation execution for the PWM duty control section 110 and delivers it thereto.

Accordingly, the PWM duty control section 110 outputs the confirmation signal (the PWM duty operation execution time and the PWM duty operation execution cycle) of the PWM duty operation execution to a counter generator 220 of the detection and failure diagnosis circuit 200 through a digital output section 140 by the interrupt signal.

Meanwhile, the motor control unit 100 further includes a failure information determination section 150 for receiving the failure determination signal determined by the detection and failure diagnosis circuit 200, and extracting only failure information to store it in a memory 160.

As described herein, the failure information determination section 150 receives the failure determination signal (e.g., the signal that determines whether or not the PWM duty operation execution time exceeds the PWM duty update reference timing, and the signal that determines whether or not the PWM duty operation execution is performed) determined in the detection and failure diagnosis circuit 200, and extracts only the failure information to store it in the memory 160 in order to be used for the warning.

The detection and failure diagnosis circuit 200 detects whether or not the PWM signal generation for motor control is updated normally based on the confirmation signal (the PWM duty operation execution time and the PWM duty operation execution cycle) of the PWM duty operation execution delivered from the PWM duty control section 110, and determines the failure diagnosis depending upon the detected result.

That is, the detection and failure diagnosis circuit 200 receives the confirmation signal (the PWM duty operation execution time and the PWM duty operation execution cycle) of the PWM duty operation execution outputted from the digital output section 140 of the motor control unit 100 to detect whether or not the PWM duty operation execution time exceeds the PWM duty update reference timing, whether or not the PWM duty operation execution is performed, etc., and determines whether or not the PWM duty operation and update, etc. fail depending upon the detected result.

For this purpose, the detection and failure diagnosis circuit 200 is configured to include a clock Phase Locked Loop (PLL) circuit 210, the counter generator 220, a failure determination circuit 230, a digital output section 240 for outputting the failure signal outputted from the failure determination circuit 230 to the motor control unit, etc.

The clock PLL circuit 210 receives a clock signal from an external oscillator 212 to generate a clock signal required for the counter generator 220.

The counter generator 220 receives the PWM duty operation execution signal outputted from the digital output section 140 of the motor control unit 100 and the clock signal outputted from the clock PPL circuit 210 to generate and output a first counter signal (a counter signal confirming the PWM duty operation execution time) and a second counter signal (a counter signal confirming the PWM duty operation execution cycle) as two kinds of counter signals required for the failure determination for the PWM duty operation and update, etc.

The failure determination circuit 230 receives the first counter signal (the counter signal confirming the PWM duty operation execution time) and the second counter signal (the counter signal confirming the PWM duty operation execution cycle) from the counter generator 220, and then compares the first counter signal (the counter signal confirming the PWM duty operation execution time) with a first failure reference register (a failure reference register for the counter signal confirming the PWM duty operation execution time), and at the same time, compares the second counter signal (the counter signal confirming the PWM duty operation execution cycle) with a second failure reference register (a failure reference register for the counter signal confirming the PWM duty operation execution cycle), and then outputs a first failure determination signal (a failure determination signal of the PWM duty operation execution time) and a second failure determination signal (a failure determination signal of the PWM duty operation execution cycle) as a signal that determines whether or not the failure occurs.

Herein, an operational flow of the system for monitoring the PWM duty operation execution in accordance with the present disclosure having the above configuration will be described as follows.

First, the PWM duty control section 110 operates a PWM duty for each PWM control cycle, and then delivers the operated PWM duty to the PWM generation module 120.

Then, the PWM generation module 120 receives the PWM duty operated in the PWM duty control section 110 and generates a PWM signal required for the motor control to output it to an inverter.

The PWM generation module 120 delivers the PWM duty operation trigger signal (e.g., the trigger signal outputted at the starting point of the PWM duty operation execution matching with the center timing of the PWM signal) to the PWM duty operation interrupt controller 130.

Subsequently, the PWM duty operation interrupt controller 130 generates an interrupt signal that outputs the confirmation signal (the PWM duty operation execution time and the PWM duty operation execution cycle) of the PWM duty operation execution based on the trigger signal for the PWM duty control section 110, and delivers it thereto.

Accordingly, the PWM duty control section 110 outputs the confirmation signal (the signal including the PWM duty operation execution time and the PWM duty operation execution cycle) of the PWM duty operation execution to the counter generator 220 of the detection and failure diagnosis circuit 200 through the digital output section 140 by the interrupt signal.

In addition, the external oscillator 212 inputs a clock signal required for generating a counter signal to the counter generator 220.

Then, based on the confirmation signal (the signal including the PWM duty operation execution time and the PWM duty operation execution cycle) of the PWM duty operation execution inputted from the digital output section 140 and the clock signal inputted from the clock PPL circuit 210, the counter generator 220 generates and outputs the first counter signal (the counter signal confirming the PWM duty operation execution time) and the second counter signal (the counter signal confirming the PWM duty operation execution cycle) as two types of counter signals required for the failure determination for the PWM duty operation and update, etc.

Figure 4:
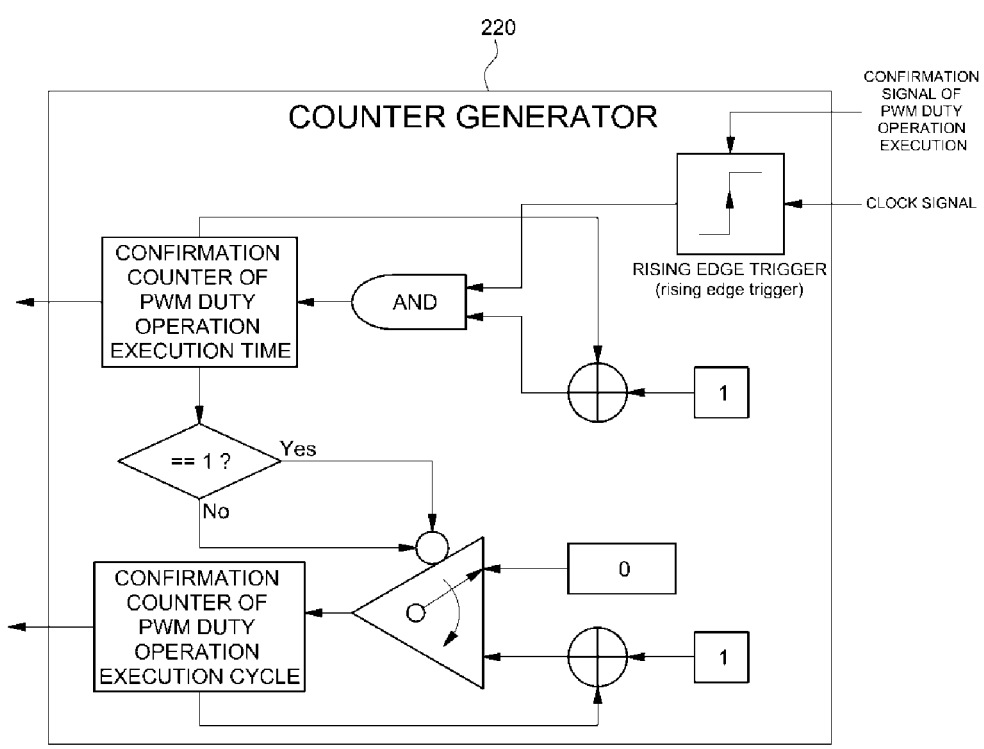
FIG. 4 is a diagram illustrating an operation of a counter generator in the configuration of the system for monitoring the PWM duty operation execution for the motor control in accordance with the present disclosure.

FIG. 4 illustrates the configuration and operation of the counter generator.

As illustrated in FIG. 4, the counter generator 220 receives the confirmation signal (the signal including the PWM duty operation execution time and the PWM duty operation execution cycle) of the PWM duty operation execution and the clock signal, and then performs the operation confirming the confirmation signal of the PWM duty operation execution for each rising edge trigger (the timing at which the clock rises from Low to High) of the clock signal.

Accordingly, the counter generator 220 increases a confirmation counter of the PWM duty operation execution time for each clock cycle by one, and when the confirmation signal of the PWM duty operation execution is 0, takes an AND operation in order to reset the confirmation counter of the PWM duty operation execution time.

In addition, when the confirmation counter of the PWM duty operation execution time is 1, it means a rising edge timing of the confirmation signal of the PWM duty operation execution, such that a switch is set to 0 at that time to reset the confirmation counter of the PWM duty operation execution cycle; and in other conditions, the confirmation counter of the PWM duty operation execution cycle is increased by 1 for each clock cycle.

After the first counter signal (the counter signal confirming the PWM duty operation execution time) and the second counter signal (the counter signal confirming the PWM duty operation execution cycle) are generated by the operation of the counter generator 220 as described above, they are outputted to the failure determination circuit 230.

Then, the failure determination circuit 230 performs the failure determination operation based on the first counter signal (the counter signal confirming the PWM duty operation execution time) and the second counter signal (the counter signal confirming the PWM duty operation execution cycle), and then outputs the first failure determination signal (the failure determination signal of the PWM duty operation execution time) and the second failure determination signal (the failure determination signal of the PWM duty operation execution cycle).

For this purpose, first, the failure determination circuit 230 receives the first counter signal (A: the counter signal confirming the PWM duty operation execution time) and the second counter signal (A': the counter signal confirming the PWM duty operation execution cycle), and then compares the first counter signal (A: the counter signal confirming the PWM duty operation execution time) with the first failure reference register (B: the failure reference register for the counter signal confirming the PWM duty operation execution time) and at the same time, compares the second counter signal (A': the counter signal confirming the PWM duty operation execution cycle) with the second failure reference register (B': the failure reference register for the counter signal confirming the PWM duty operation execution cycle).

Figure 5:
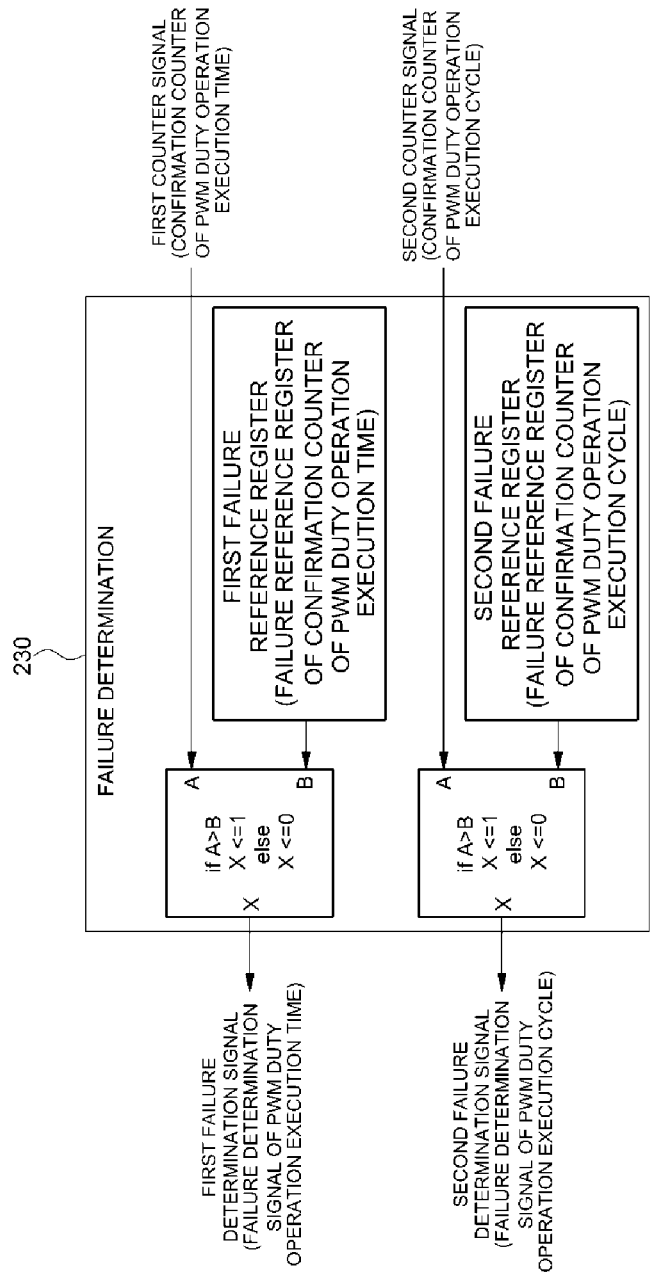
FIG. 5 is a diagram illustrating an operation of a failure determination circuit in the configuration of the system for monitoring the PWM duty operation execution for the motor control in accordance with the present disclosure.

As the comparison result, as illustrated in FIG. 5, when the first counter signal (A: the counter signal confirming the PWM duty operation execution time) exceeds the first failure reference register (B: the failure reference register for the counter signal confirming the PWM duty operation execution time), the failure determination signal of the PWM duty operation execution time is set to 1, while when the first counter signal (A: the counter signal confirming the PWM duty operation execution time) is less than the first failure reference register (B: the failure reference register for the counter signal confirming the PWM duty operation execution time), the failure determination signal of the PWM duty operation execution time is set to 0.

Accordingly, the failure determination circuit 230 outputs the failure determination signal of the PWM duty operation execution time that is set to 1, and the first failure determination signal (the failure determination signal of the PWM duty operation execution time) including the failure determination signal of the PWM duty operation execution time that is set to 0 to the failure information determination section 150 included in the motor control unit 100.

In addition, when the second counter signal (A': the counter signal confirming the PWM duty operation execution cycle) exceeds the second failure reference register (B': the failure reference register for the counter signal confirming the PWM duty operation execution cycle), the failure determination signal of the PWM duty operation execution cycle is set to 1, while when the second counter signal (A': the counter signal confirming the PWM duty operation execution cycle) is less than the second failure reference register (B': the failure reference register for the counter signal confirming the PWM duty operation execution cycle), the failure determination signal of the PWM duty operation execution cycle is set to 0.

Accordingly, the failure determination circuit 230 outputs the failure determination signal of the PWM duty operation execution cycle that is set to 1, and the second failure determination signal (the failure determination signal of the PWM duty operation execution cycle) including the failure determination signal of the PWM duty operation execution cycle that is set to 0 to the failure information determination section 150 included in the motor control unit 100.

Then, the failure information determination section 150 analyzes the first failure determination signal and the second failure determination signal, stores only the failure information determined as failure in the memory 160, and as a follow-up measure, the motor control unit 100 performs a control that warns a user (e.g., a driver of an eco-friendly vehicle on which the motor is mounted) the failure information stored in the memory 160.

Figure 6:
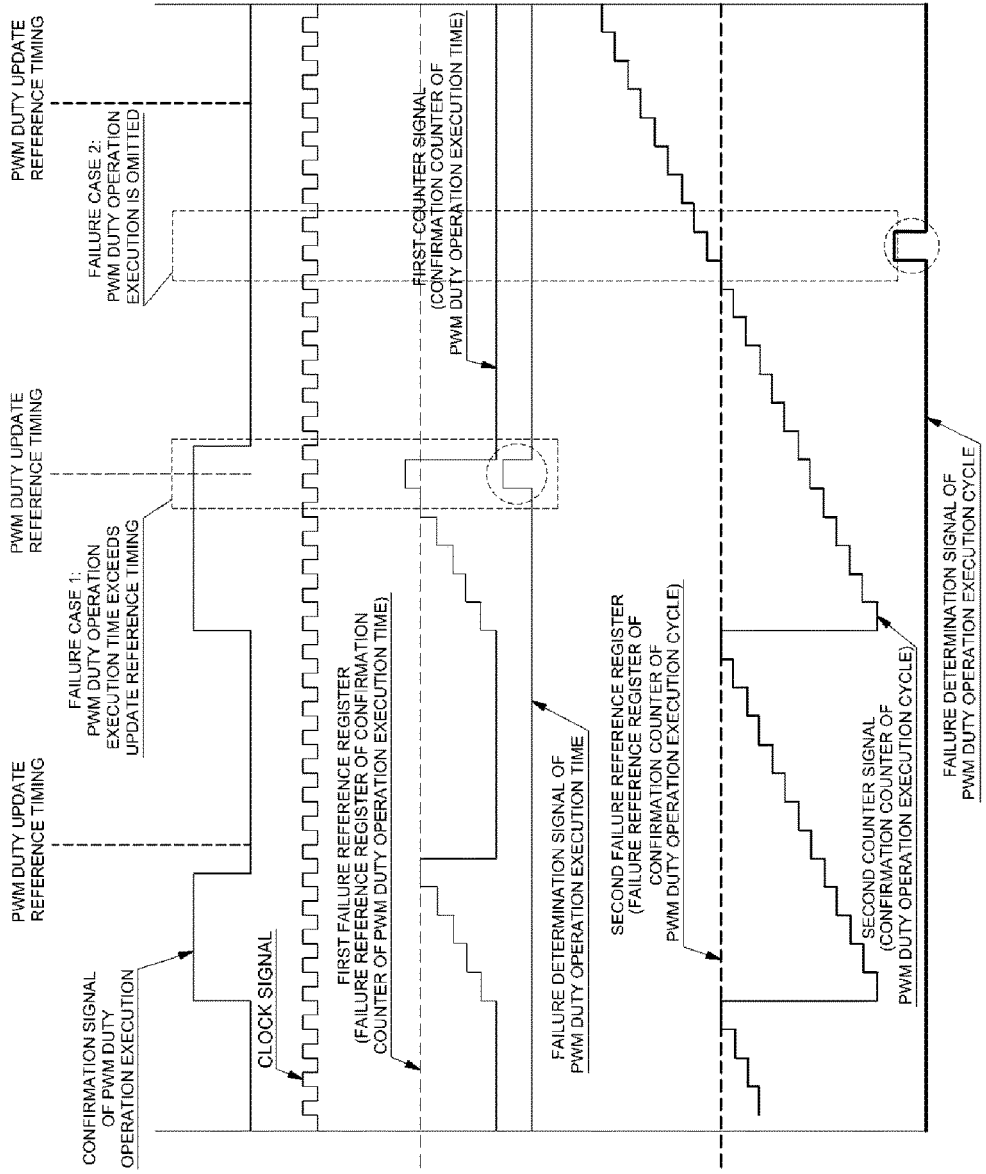
FIG. 6 is a graph illustrating a failure determination logic depending upon an operation of the system for monitoring the PWM duty operation execution for the motor control in accordance with the present disclosure.

The failure information determination section 150 analyzes the first failure determination signal and the second failure determination signal, and as illustrated in the left part of FIG. 6, determines that the PWM duty update is performed normally when the PWM duty operation execution time does not exceed the PWM duty update reference timing, that is, when the first counter signal (the counter signal confirming the PWM duty operation execution time) is less than the first failure reference register (the failure reference register for the counter signal confirming the PWM duty operation execution time) and does not to proceed the storing the failure information in the memory 160.

On the other hand, as illustrated in the middle part of FIG. 6, as an example of a failure case, when the PWM duty operation execution time exceeds the PWM duty update reference timing, that is, when the first counter signal (the counter signal confirming the PWM duty operation execution time) exceeds the first failure reference register (the failure reference register for the counter signal confirming the PWM duty operation execution time), the failure information determination section 150 determines as the failure that the PWM duty is not updated normally, and stores the failure information at this time in the memory 160.

In addition, as illustrated in the right part of FIG. 6, as another example of the failure case, when the PWM duty operation execution itself is omitted, that is, when the second counter signal (the counter signal confirming the PWM duty operation execution cycle) exceeds the second failure reference register (the failure reference register for the counter signal confirming the PWM duty operation execution cycle), the failure information determination section 150 determines as the failure that the PWM duty is not updated normally, and stores the failure information at this time in the memory 160.

Meanwhile, it is possible for the motor control unit 100 to warn the user (e.g., the driver of the eco-friendly vehicle on which the motor is mounted) with the failure information stored in the memory 160 through a general warning means (a display or the like), thus inducing the maintenance for the motor control unit.

Having described the embodiments of the present disclosure in detail with reference to the drawings, the present disclosure is not limited to the above-described embodiments, and various modifications can be made without departing from the technical scope of the present disclosure.

What is claimed is:

1. A system for monitoring pulse width modulation (PWM) duty operation execution for motor control, the system comprising:
    a motor control unit for operating a PWM duty for motor control, and outputting a confirmation signal of the PWM duty operation execution for determining whether or not the PWM duty is updated normally to a detection and failure diagnosis circuit; and
    the detection and failure diagnosis circuit for outputting a failure determination signal for determining whether or not the operation execution and update of the PWM duty are performed normally within a PWM duty update reference timing based on the confirmation signal of the PWM duty operation execution,
    wherein the detection and failure diagnosis circuit comprises:
        a clock PLL circuit for receiving a clock signal from an external oscillator to generate a clock signal required for a counter generator;
        the counter generator for receiving a PWM duty operation execution signal outputted from the digital output section of the motor control unit and the clock signal outputted from the clock PLL circuit to generate and output a first counter signal and a second counter signal required for failure determination for the PWM duty operation and update; and
        a failure determination circuit for outputting a first failure determination signal and a second failure determination signal as a signal for determining whether or not the PWM duty operation execution and update fails based on the first counter signal and the second counter signal outputted from the counter generator.

2. The system for monitoring the PWM duty operation execution of claim 1, wherein the motor control unit comprises:

a PWM duty control section for operating a duty for each PWM control cycle for a motor;

a PWM generation module for receiving the duty operated in the PWM duty control section to generate a PWM signal; and a PWM duty operation interrupt controller for receiving a PWM duty operation trigger signal from the PWM generation module, and then generating an interrupt signal that outputs the confirmation signal of the PWM duty operation execution for the PWM duty control section and delivering it thereto.

3. The system for monitoring the PWM duty operation execution of claim 2, wherein the PWM duty control section outputs the confirmation signal of the PWM duty operation execution including a PWM duty operation execution time and a PWM duty operation execution cycle to the detection and failure diagnosis circuit through a digital output section by the interrupt signal.

4. The system for monitoring the PWM duty operation execution of claim 2, wherein the motor control unit further comprises a failure information determination section for receiving a failure determination signal in the detection and failure diagnosis circuit, and extracting only failure information to store it in a memory.

5. The system for monitoring the PWM duty operation execution of claim 1, wherein the failure determination circuit outputs the failure determination signal of the PWM duty operation execution time that is set to 1 and the first failure determination signal including the failure determination signal of the PWM duty operation execution time that is set to 0 to the failure information determination section of the motor control unit.

6. The system for monitoring the PWM duty operation execution of claim 1, wherein the failure determination circuit outputs the failure determination signal of the PWM duty operation execution cycle that is set to 1 and the second failure determination signal including the failure determination signal of the PWM duty operation execution cycle that is set to 0 to the failure information determination section of the motor control unit.

7. The system for monitoring the PWM duty operation execution of claim 1, wherein the failure information determination section analyzes the first failure determination signal and the second failure determination signal to store only failure information indicating a failure in a memory.

8. The system for monitoring the PWM duty operation execution of claim 7, wherein the motor control unit performs a control that warns a user of the failure information stored in the memory.

* * * * *